United States Patent
Hsu et al.

(10) Patent No.: US 10,186,488 B2
(45) Date of Patent: Jan. 22, 2019

(54) MANUFACTURING METHOD OF SEMICONDUCTOR PACKAGE AND MANUFACTURING METHOD OF SEMICONDUCTOR DEVICE

(71) Applicant: MEDIATEK Inc., Hsin-Chu (TW)

(72) Inventors: Wen-Sung Hsu, Zhubei (TW); Shih-Chin Lin, Taoyuan (TW); Tao Cheng, Zhubei (TW); Andrew C. Chang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/672,440

(22) Filed: Aug. 9, 2017

(65) Prior Publication Data
US 2017/0338183 A1    Nov. 23, 2017

Related U.S. Application Data

(63) Continuation of application No. 15/162,760, filed on May 24, 2016, now Pat. No. 9,761,534.
(Continued)

(51) Int. Cl.
*H01L 23/00* (2006.01)
*H01L 21/00* (2006.01)
(Continued)

(52) U.S. Cl.
CPC ........ *H01L 23/5389* (2013.01); *H01L 21/486* (2013.01); *H01L 21/4846* (2013.01);
(Continued)

(58) Field of Classification Search
CPC .......... H01L 23/5389; H01L 23/49827; H01L 23/50; H01L 25/162; H01L 25/165;
(Continued)

(56) References Cited

U.S. PATENT DOCUMENTS

| 8,445,323 B2 | 5/2013 | Lin et al. |
| 9,034,694 B1 | 5/2015 | Kalandar et al. |

(Continued)

FOREIGN PATENT DOCUMENTS

| CN | 103943600 A | 7/2014 |
| TW | 201532209 A | 8/2015 |

OTHER PUBLICATIONS

TIPO Office Action dated Jan. 23, 2017 in Taiwan application (No. 105120336).
(Continued)

*Primary Examiner* — Sonya D. McCall-Shepard
(74) *Attorney, Agent, or Firm* — McClure, Qualey & Rodack, LLP

(57) ABSTRACT

A manufacturing method of a semiconductor package includes the follow steps. Firstly, a carrier is provided. Then, a package substrate is formed. Then, a first electronic component is disposed above the second conductive layer of the package substrate. Then, a second package body encapsulating the first electronic component and the second conductive layer is formed. Then, the carrier is carried. Wherein in the step of forming the package substrate includes a step of forming a first conductive layer on the carrier, a step of forming a first pillar layer on the first conductive layer, a step of forming a first package body encapsulating the first conductive layer and the first pillar layer and a step of forming a second conductive layer on the first pillar layer.

20 Claims, 16 Drawing Sheets

Related U.S. Application Data

(60) Provisional application No. 62/221,262, filed on Sep. 21, 2015.

(51) Int. Cl.

| | | |
|---|---|---|
| *H01L 25/00* | (2006.01) | |
| *H01L 23/538* | (2006.01) | |
| *H01L 23/31* | (2006.01) | |
| *H01L 25/10* | (2006.01) | |
| *H01L 21/48* | (2006.01) | |
| *H01L 21/56* | (2006.01) | |
| *H01L 23/14* | (2006.01) | |
| *H01L 25/065* | (2006.01) | |
| *H01L 25/16* | (2006.01) | |
| *H01L 23/498* | (2006.01) | |
| *H01L 23/50* | (2006.01) | |

(52) U.S. Cl.
CPC ........ *H01L 21/4853* (2013.01); *H01L 21/565* (2013.01); *H01L 21/568* (2013.01); *H01L 23/145* (2013.01); *H01L 23/3114* (2013.01); *H01L 23/49827* (2013.01); *H01L 23/50* (2013.01); *H01L 25/0657* (2013.01); *H01L 25/10* (2013.01); *H01L 25/105* (2013.01); *H01L 25/16* (2013.01); *H01L 25/162* (2013.01); *H01L 25/165* (2013.01); *H01L 25/50* (2013.01); *H01L 23/3128* (2013.01); *H01L 23/49816* (2013.01); *H01L 24/13* (2013.01); *H01L 24/16* (2013.01); *H01L 24/48* (2013.01); *H01L 24/81* (2013.01); *H01L 2224/131* (2013.01); *H01L 2224/16227* (2013.01); *H01L 2224/16238* (2013.01); *H01L 2224/48227* (2013.01); *H01L 2224/81005* (2013.01); *H01L 2225/1023* (2013.01); *H01L 2225/1041* (2013.01); *H01L 2225/1058* (2013.01); *H01L 2924/00014* (2013.01); *H01L 2924/1533* (2013.01); *H01L 2924/1579* (2013.01); *H01L 2924/15311* (2013.01); *H01L 2924/19041* (2013.01); *H01L 2924/19042* (2013.01); *H01L 2924/19043* (2013.01); *H01L 2924/19106* (2013.01)

(58) Field of Classification Search
CPC ... H01L 25/0657; H01L 25/10; H01L 21/568; H01L 25/105; H01L 23/3114; H01L 24/16; H01L 24/81; H01L 24/48; H01L 2924/19106; H01L 24/13; H01L 2924/1533; H01L 2924/15311; H01L 2224/81005; H01L 2225/1041
See application file for complete search history.

(56) References Cited

U.S. PATENT DOCUMENTS

| | | |
|---|---|---|
| 9,171,797 B2 | 10/2015 | Lin et al. |
| 9,761,534 B2 | 9/2017 | Hsu et al. |
| 2010/0314741 A1 | 12/2010 | Lee et al. |
| 2011/0140259 A1 | 6/2011 | Cho et al. |
| 2012/0056321 A1 | 3/2012 | Pagaila |
| 2012/0061814 A1 | 3/2012 | Camacho et al. |
| 2014/0227832 A1 | 8/2014 | Wang et al. |
| 2014/0252646 A1 | 9/2014 | Hung et al. |
| 2015/0044819 A1 | 2/2015 | Lin et al. |
| 2016/0027764 A1 | 1/2016 | Kim et al. |
| 2016/0172334 A1 | 6/2016 | Hsu et al. |

OTHER PUBLICATIONS

EPO Search Report dated Feb. 24, 2017 in European application (No. 16175721.6-1552).
TIPO Office Action dated Mar. 30, 2017 in Taiwan application (No. 105120336).
CN Office Action dated Aug. 20, 2018 in Chinese application (No. 201610614954.0).

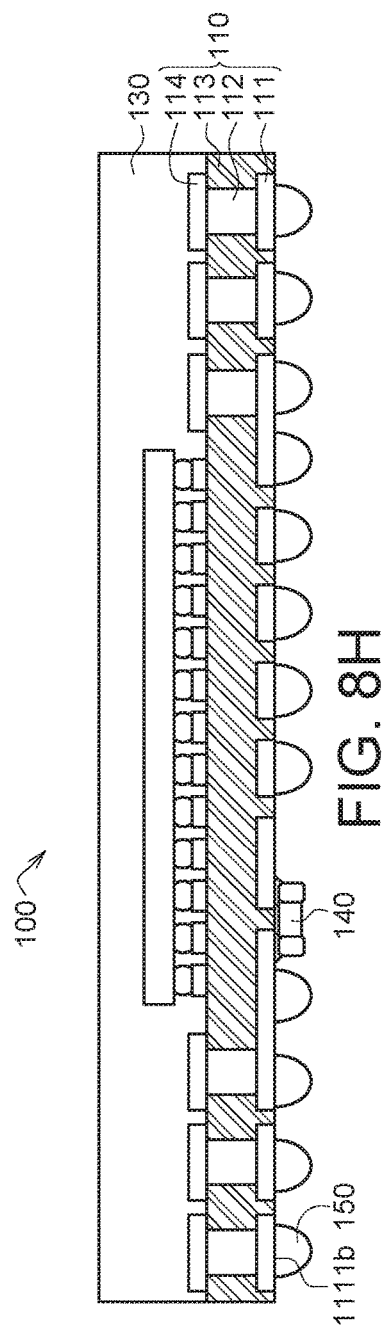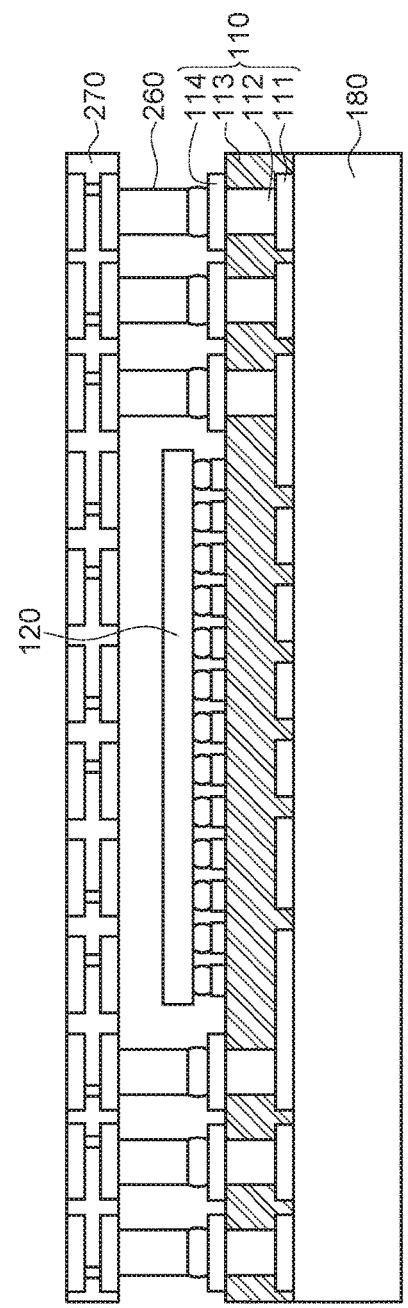

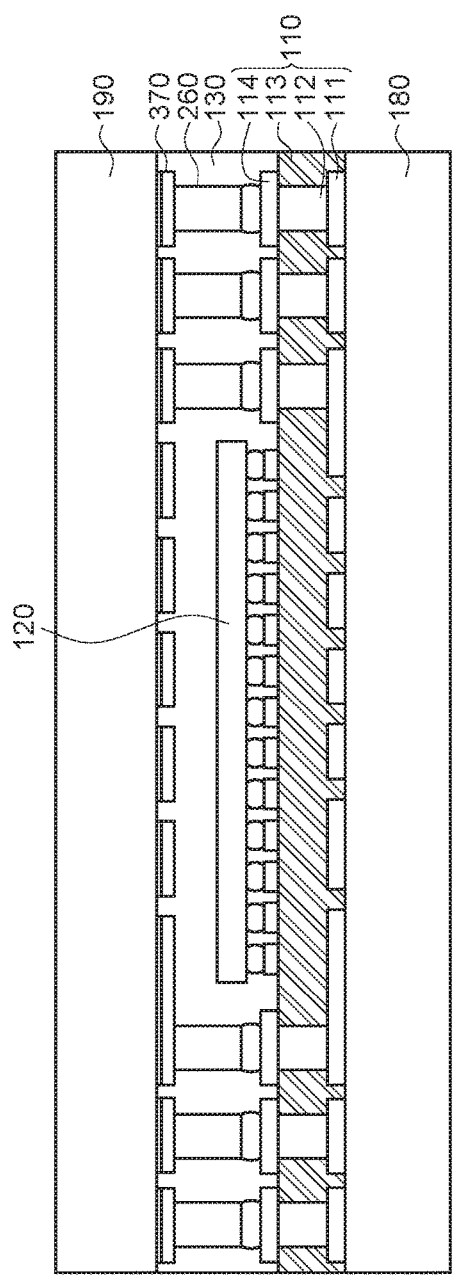
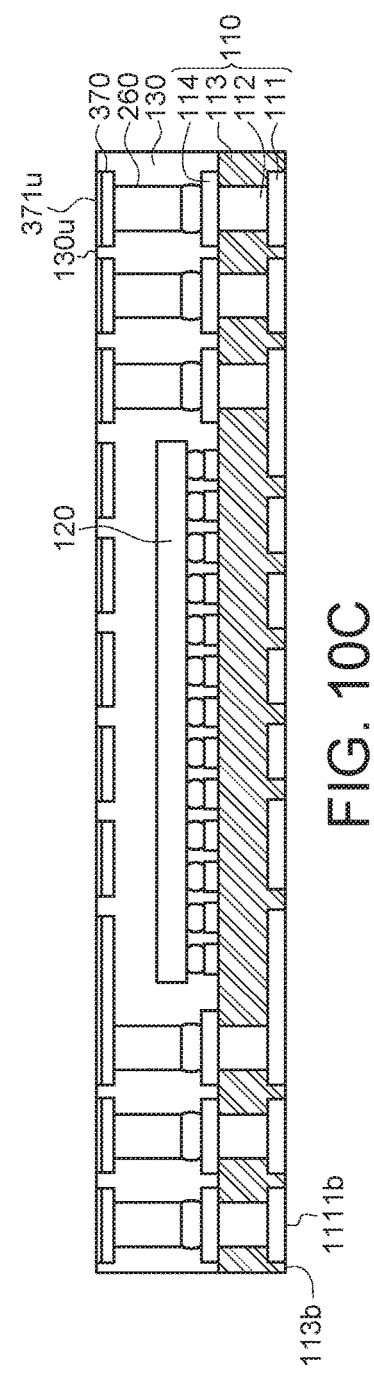
FIG. 10B
FIG. 10C

MANUFACTURING METHOD OF SEMICONDUCTOR PACKAGE AND MANUFACTURING METHOD OF SEMICONDUCTOR DEVICE This application is a continuation application (CA) of U.S. application Ser. No. 15/162,760, filed on May 24, 2016, now U.S. Pat. No. 9,761,534, which claims the benefit of U.S. Provisional application No. 62/221,262 filed on Sep. 21, 2015, the contents of which are incorporated herein by reference.

FIELD OF THE INVENTION

The invention relates to a manufacturing method of a semiconductor package and a manufacturing method of a semiconductor device, and more particularly to a manufacturing method of a thin semiconductor package and a manufacturing method of a thin semiconductor device.

BACKGROUND OF THE INVENTION

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical.

Package-on-package (PoP) is now the fastest growing semiconductor package technology since it is a cost-effective solution to high-density system integration in a single package. In a PoP structure, various packages are integrated in a single semiconductor package to reduce the size. Accordingly, there exists a need to provide a semiconductor package to overcomes, or at least reduces the above-mentioned problems.

Therefore, it is important to increase the performance of the 3D graphic processing circuit while reducing the consumption of the electric power and extending the operating time of the mobile device.

SUMMARY OF THE INVENTION

In another embodiment of the invention, a manufacturing method of a semiconductor package is provided. The manufacturing method includes the following steps. A carrier is provided; a package body is formed and includes the steps of forming a first conductive layer on the carrier, forming a first pillar layer on the first conductive layer, forming a first package body encapsulating the first conductive layer and the first pillar layer, and forming a second conductive layer on the first pillar layer; a first electronic component is disposed above the second conductive layer of the package substrate; a second package body encapsulating the first electronic component and the second conductive layer is formed, and the carrier is removed.

In another embodiment of the invention, a manufacturing method of a semiconductor device is provided. The manufacturing method includes the following steps. A carrier is provided; a package body is formed and includes the steps of forming a first conductive layer on the carrier, forming a first pillar layer on the first conductive layer, forming a first package body encapsulating the first conductive layer and the first pillar layer, and forming a second conductive layer on the first pillar layer; a first electronic component is disposed above the second conductive layer of the package substrate; a second package body encapsulating the first electronic component, the second conductive layer and the second pillar layer is formed, and the carrier is removed.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIGS. 8A to 8H illustrate manufacturing processes of the semiconductor package of FIG. 1;

FIGS. 9A to 9B illustrate manufacturing processes of the semiconductor package of FIG. 2;

FIGS. 10A to 10C illustrate manufacturing processes of the semiconductor package of FIG. 3;

DETAILED DESCRIPTION OF PREFERRED EMBODIMENTS

Figure 1:
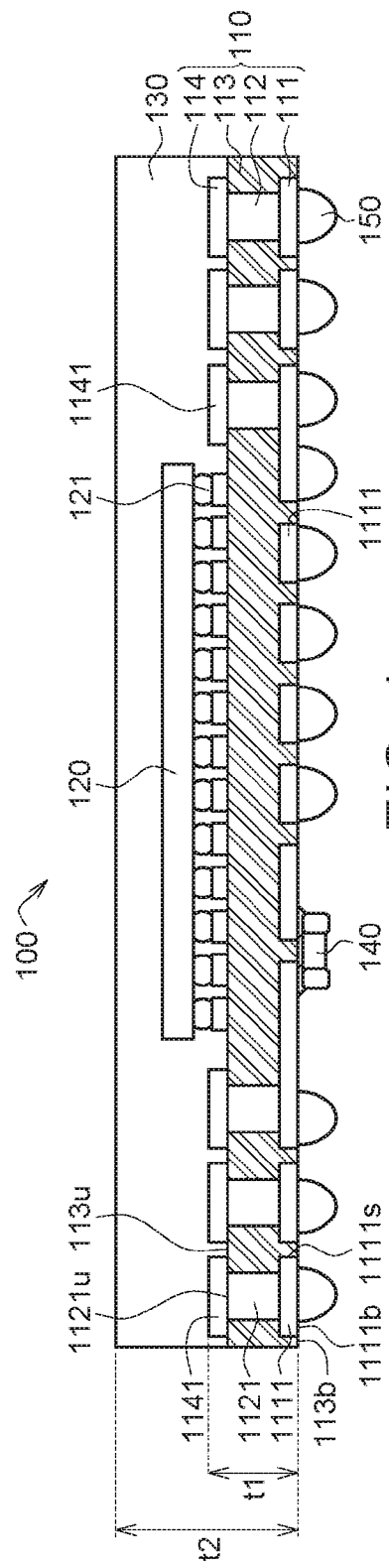
FIG. 1 illustrates a diagram of a semiconductor package according to an embodiment of the invention.

FIG. 1 illustrates a diagram of a semiconductor package 100 according to an embodiment of the invention. The semiconductor package 100 includes a package substrate 110, a first electronic component 120, a second package body 130, a second electronic component 140 and at least one conductive contact 150.

The package substrate 110 includes a first conductive layer 111, a first pillar layer 112, a first package body 113 and a second conductive layer 114.

The first conductive layer 111 includes a plurality of elements 1111, such as pads, traces or combination thereof. Each element 1111 has a first lower surface 1111b and a first lateral surface 1111s, and the first package body 113 has a second lower surface 113b. The first lower surface 1111b is exposed from the second lower surface 113b, and the first lower surface 1111b is aligned with the second lower surface 113b. Each element 1111 may be a multi-layered structure or single-layered structure. For example, each element 1111 includes nickel layer, gold layer, palladium layer, copper layer or combination thereof.

The first pillar layer 112 connects the first conductive layer 111 to the second conductive layer 114. In the present embodiment, the first pillar layer 112 includes a plurality of pillars 1121. The pillars 1121 are made of a material such as copper. Each pillar 1121 has a first upper surface 1121*u*, and the first package body 113 has a second upper surface 113*u*, wherein the first upper surface 1121*u* is exposed from the second upper surface 113*u* and aligned with the second upper surface 113*u*.

The first package body 113 encapsulates the first conductive layer 111 and the first pillar layer 112. For example, the first package body 113 encapsulates the first lateral surface 1111*s* of the first conductive layer 111 and the lateral surface of each pillar 1121.

The first package body 113 may be a molding compound which is made of a material including, for example, a Novolac-based resin, an epoxy-based resin, a silicone-based resin, or another suitable encapsulant. Suitable fillers also can be included, such as powdered $SiO_2$.

Since the first package body 113 is the molding compound, the package substrate 110 has thin thickness t1. Compared to the silicon substrate, the thickness t1 of the package substrate 110 is much smaller. In general, the silicon substrate has a thickness larger than 100 micrometers. In the present embodiment, the thickness t1 of the package substrate 110 is smaller, and accordingly the thickness t2 of the semiconductor package 100 may be reduced.

The second conductive layer 114 includes a plurality of elements 1141, such as pads, traces or combination thereof. Each element 1141 may be a multi-layered structure or single-layered structure. For example, the element 1141 may be nickel layer, gold layer, copper layer, palladium layer or combination thereof.

In the present embodiment, the first electronic component 120 is coupled to the second conductive layer 114 of the package substrate 110 in a "face-down" orientation and electrically connected to the second conductive layer 114 via a plurality of conductive contacts 121. This configuration is sometimes referred to as "flip-chip". The conductive contact 121 may be solder ball, conductive pillar, etc.

In other embodiments, the first electronic component 120 may be coupled to the package substrate 110 in a "face-up" orientation, and electrically connected to the package substrate 110 via a plurality of conductive bond wires (not shown). The first electronic component 120 may be an active chip or a passive component, such as a resistor, an inductor or a capacitor. In another embodiment, the number of the first electronic component 120 may be several. In addition, the first electronic component 120 may be, for example, a chip, a passive component, etc.

The second package body 130 formed on the second upper surface 113*u* of the package substrate 110 encapsulates the second conductive layer 114 and the first electronic component 120. The second package body 130 may be made of a material which is the same as that of the first package body 113.

The second electronic component 140 is disposed on the first lower surface 1111*b* of the first substrate 110 and electrically connects to the first conductive layer 111. In one embodiment, the second electronic component 140 is, for example, passive component, such as a resistor, an inductor or a capacitor.

The conductive contacts 150 are disposed on the first lower surface 1111*b* of the first substrate 110. The semiconductor package 100 is disposed on and electrically connected to an exterior circuit, such as a circuit board, through the conductive contacts 150. The conductive contacts 150 may be solder ball, conductive pillar, etc.

Figure 2:
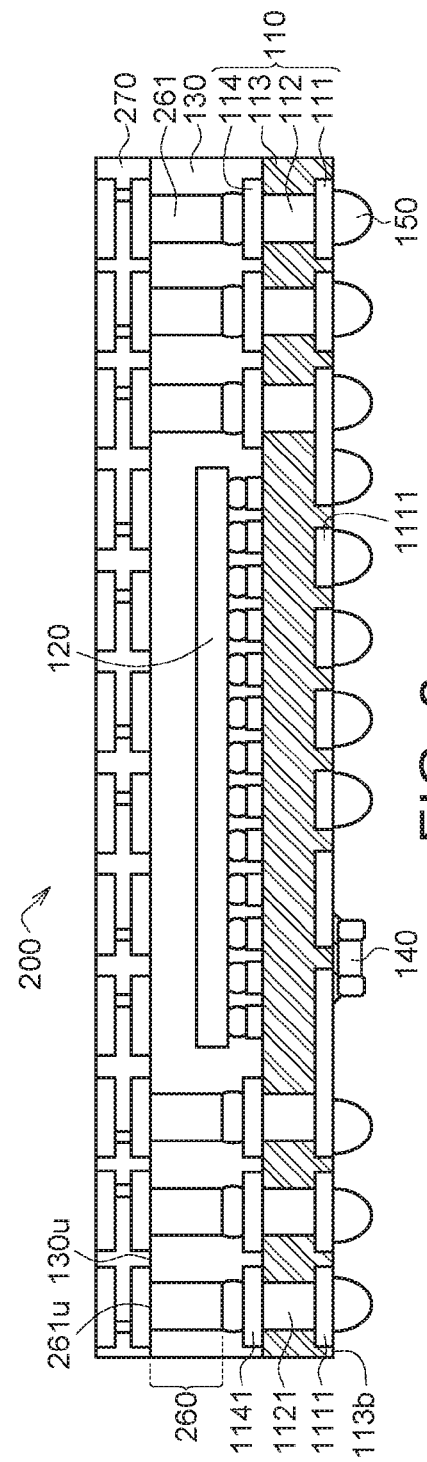
FIG. 2 illustrates a diagram of a semiconductor package according to another embodiment of the invention.

FIG. 2 illustrates a diagram of a semiconductor package 200 according to another embodiment of the invention. The semiconductor package 200 includes the package substrate 110, the first electronic component 120, the second package body 130, the second electronic component 140, at least one conductive contact 150, a second pillar layer 260 and an interposer 270.

The second package body 130 further encapsulates the second pillar layer 260. The second pillar layer 260 includes a plurality of pillars 261 connecting the second conductive layer 114 to the interposer 270.

The interposer 270 is disposed on the second package body 130 and electrically connects to the package substrate 110 through the second pillar layer 260 encapsulated within second package body 130. The interposer 270 may be electrically connected to the first electronic component 120 through the second pillar layer 260 and the package substrate 110.

Each pillar 261 has a third upper surface 261*u*, and the second package body 130 has a fourth upper surface 130*u*, wherein the third upper surface 261*u* is exposed from the fourth upper surface 130*u* and aligned with the fourth upper surface 130*u*.

Figure 3:
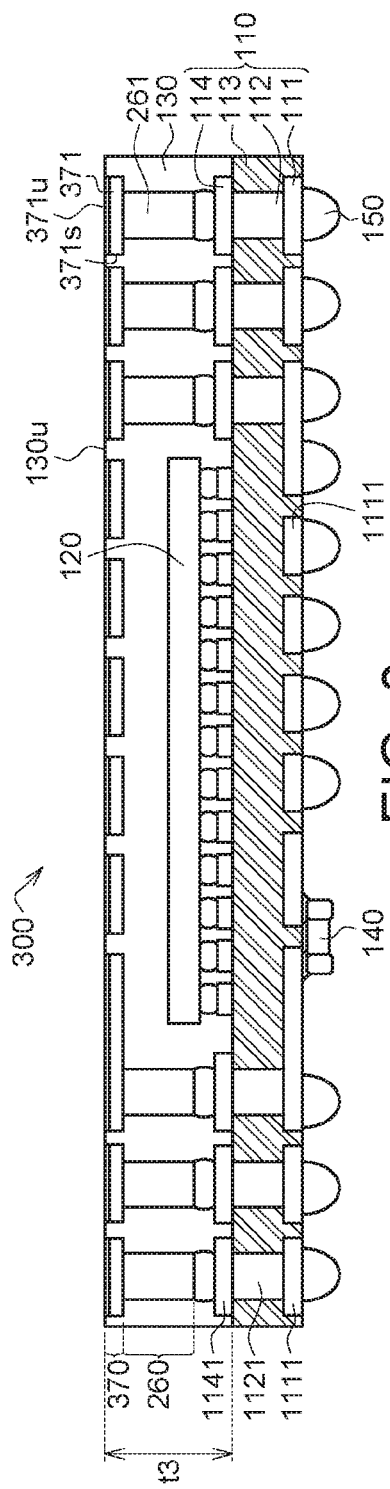
FIG. 3 illustrates a diagram of a semiconductor package according to another embodiment of the invention.

FIG. 3 illustrates a diagram of a semiconductor package 300 according to another embodiment of the invention. The semiconductor package 300 includes the package substrate 110, the first electronic component 120, the second package body 130, the second electronic component 140, at least one conductive contact 150, the second pillar layer 260 and a fourth conductive layer 370.

The second package body 130 encapsulates the second conductive layer 114, the second pillar layer 260 and the fourth conductive layer 370.

The second pillar layer 260 electrically connects the second conductive layer 114 to the fourth conductive layer 370, such that the first electronic component 120 may electrically connect the fourth conductive layer 370 through the package substrate 110 and the second pillar layer 260.

The fourth conductive layer 370 includes a plurality of elements 371, such as pads, traces or combination thereof. Each element 371 has a fifth upper surface 371*u*, and the second package body 130 has the fourth upper surface 130*u*, wherein the fifth upper surface 371*u* is exposed from the fourth upper surface 130*u* and aligned with the fourth upper surface 130*u*.

Each element 371 may be a multi-layered structure or single-layered structure. For example, the each element 371 includes nickel layer, gold layer, palladium layer, copper layer or combination thereof.

The fourth conductive layer 370 is embedded in the second package body 130. For example, each element 371 (trace or pad) has a second lateral surface 371*s* which is encapsulated by the second package body 130. Since the fourth conductive layer 370 is embedded in the second package body 130, the second package body 130 has a thin thickness t3.

Figure 4:
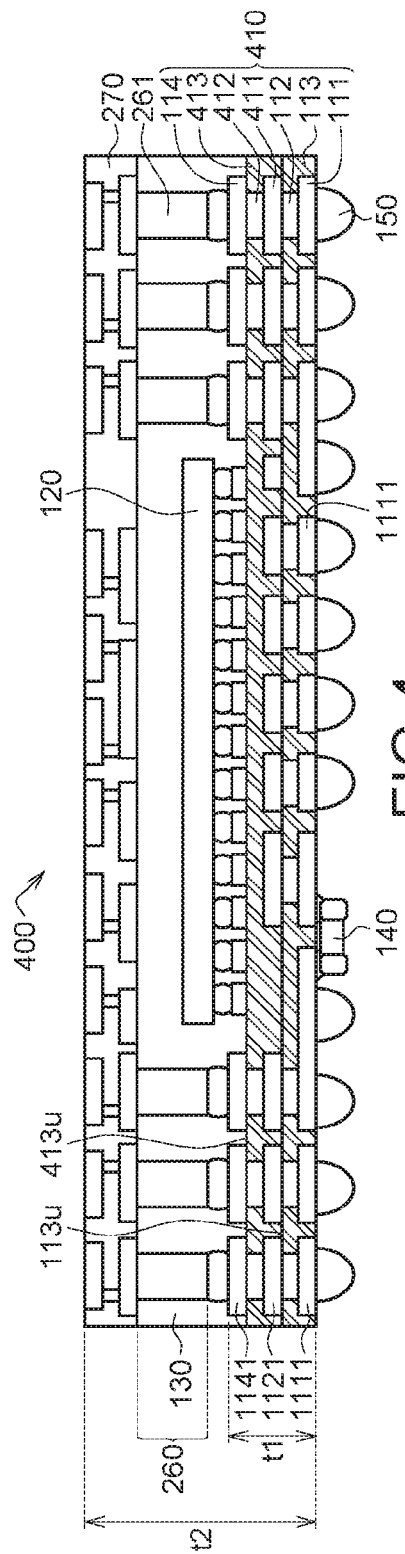
FIG. 4 illustrates a diagram of a semiconductor package according to another embodiment of the invention.

FIG. 4 illustrates a diagram of a semiconductor package 400 according to another embodiment of the invention. The semiconductor package 400 includes a package substrate 410, the first electronic component 120, the second package body 130, the second electronic component 140, at least one conductive contact 150, the second pillar layer 260 and the interposer 270.

In the present embodiment, the package substrate 410 is multi-layered package structure. For example, the package substrate 410 includes the first conductive layer 111, the first pillar layer 112, the first package body 113, the second conductive layer 114, a third conductive layer 411, a third pillar layer 412 and a third package body 413. The first conductive layer 111, the first pillar layer 112 and the first package body 113 together form a first single-layered package structure, and the third conductive layer 411, the third pillar layer 412 and the third package body 413 form a second single-layered package structure. In another embodiment, the number of the layers of the package substrate 410 may be more than two.

The third conductive layer 411 is formed on the second upper surface 113u of the first package body 113 and electrical connects to the first pillar layer 112. The third pillar layer 412 connects the third conductive layer 411 to the second conductive layer 114. The third package body 413 encapsulates the third pillar layer 412 and the third conductive layer 411. In the present embodiment, the second conductive layer 114 is formed on a sixth upper surface 413u of the third package body 413 and electrically connects to the first conductive layer 111 through the third conductive layer 411, the third pillar layer 412 and the first pillar layer 112.

In addition, the third package body 413 may be made of a material which is the same as that of the first package body 113.

Since the first package body 113 and the third package body 413 are the molding compounds, the package substrate 410 has thin thickness t1. Compared to the silicon substrate, the thickness t1 of the package substrate 410 is much smaller. In general, the silicon substrate has the thickness larger than 100 micrometers. In the present embodiment, the thickness t1 of the package substrate 410 is smaller, and accordingly the thickness t2 of the semiconductor package 100 may be reduced.

Figure 5:
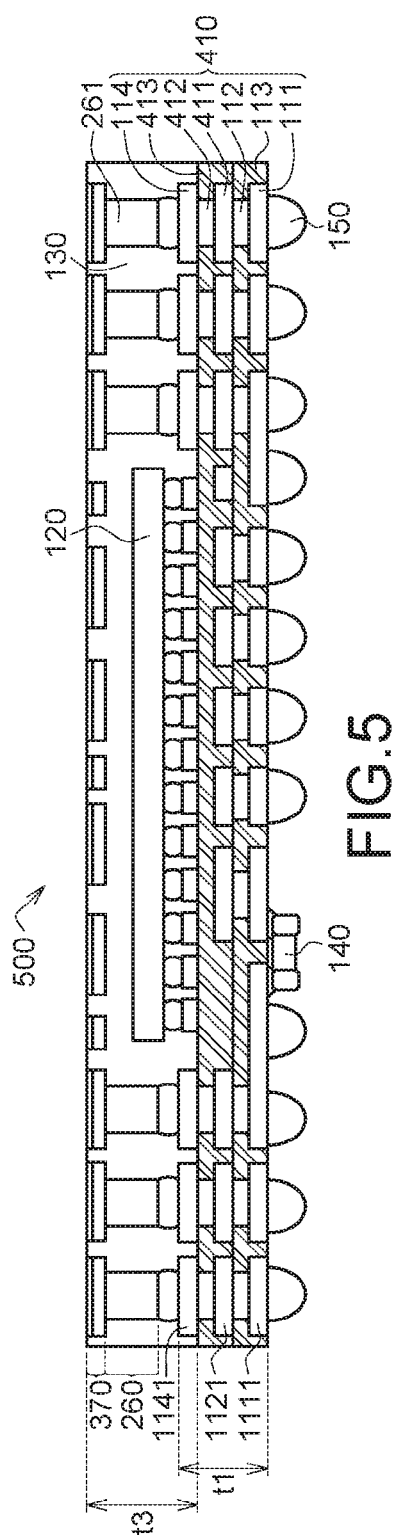
FIG. 5 illustrates a diagram of a semiconductor package according to another embodiment of the invention.

FIG. 5 illustrates a diagram of a semiconductor package 500 according to another embodiment of the invention. The semiconductor package 500 includes the package substrate 410, the first electronic component 120, the second package body 130, the second electronic component 140, at least one conductive contact 150, the second pillar layer 260 and the fourth conductive layer 370.

In the present embodiment, since the fourth conductive layer 370 is embedded in the second package body 130, the second package body 130 has the thin thickness t3. The second pillar layer 260 electrically connects the second conductive layer 114 to the fourth conductive layer 370, such that the first electronic component 120 may electrically connect the fourth conductive layer 370 through the package substrate 410 and the second pillar layer 260.

Figure 6:
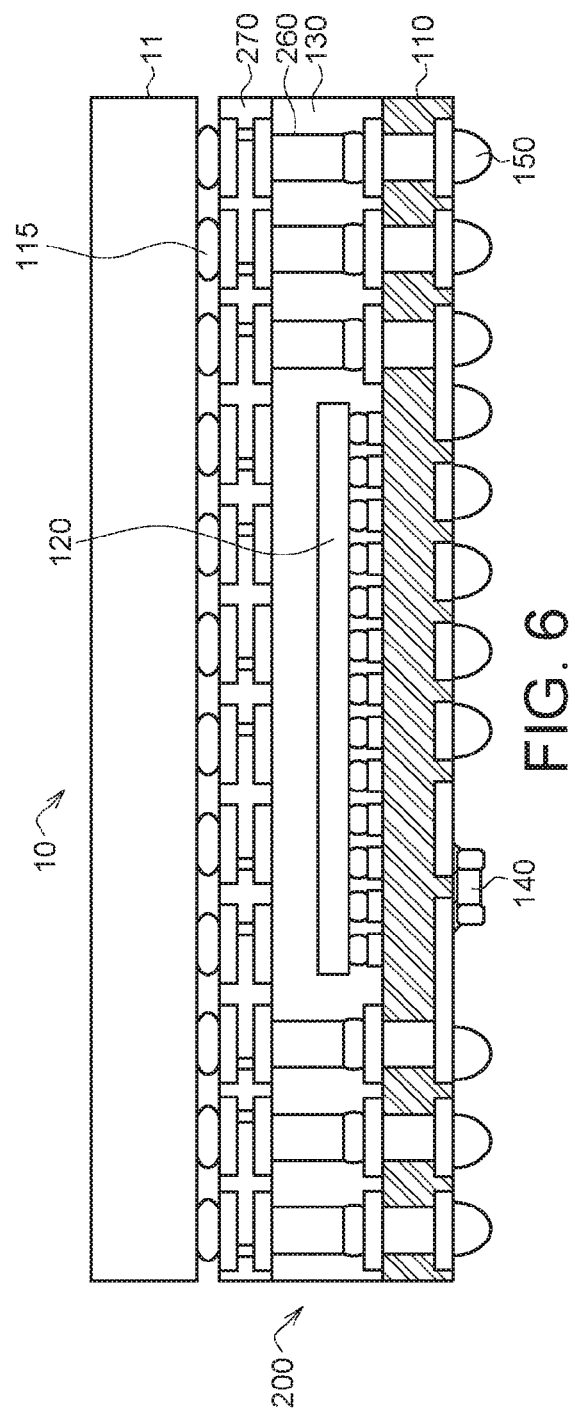
FIG. 6 illustrates a diagram of a semiconductor device according to one embodiment of the invention.

FIG. 6 illustrates a diagram of a semiconductor device 10 according to one embodiment of the invention. The semiconductor device 10 includes the semiconductor package 200 and a third electronic component 11. In another embodiment, the third electronic component 11 may be a semiconductor package including a plurality of dies, such as DRAMs stacked to each other.

The third electronic component 11 is disposed on the interposer 270 of the semiconductor package 200 in a "face-down" orientation and electrically connected to the interposer 270 via a plurality of conductive contacts 115. The conductive contacts 115 may be solder ball, conductive pillar, etc. In another embodiment, the third electronic component 11 is disposed on the interposer 270 in a "face-up" orientation and electrically connected to the interposer 270 via a plurality of conductive bond wires (not shown). The third electronic component 11 electrically connects to the first electronic component 120 through the interposer 270, the second pillar layer 260 and the package substrate 110. In addition, the third electronic component 11 electri-cally connects to the conductive contacts 150 through the interposer 270, the second pillar layer 260 and the package substrate 110.

Figure 7:
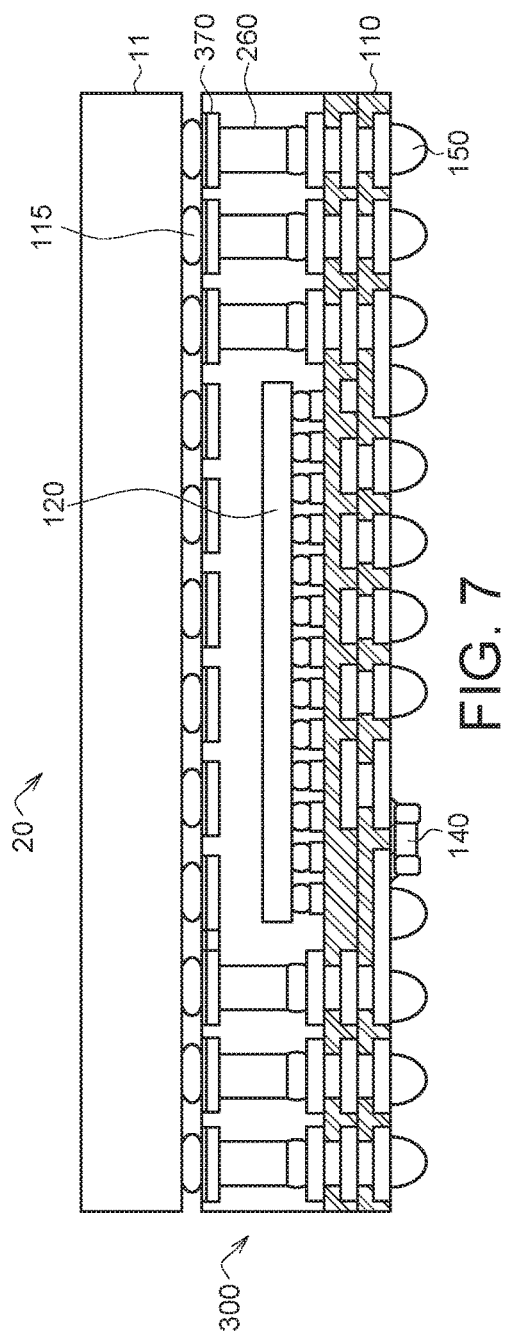
FIG. 7 illustrates a diagram of a semiconductor device according to another embodiment of the invention.

FIG. 7 illustrates a diagram of a semiconductor device 20 according to another embodiment of the invention. The semiconductor device 20 includes the semiconductor package 300 and a third electronic component 11.

The third electronic component 11 is disposed on the fourth conductive layer 370 of the semiconductor package 300 in a "face-down" orientation or in a "face-up" orientation. The third electronic component 11 electrically connects to the first electronic component 120 through the fourth conductive layer 370, the second pillar layer 260 and the package substrate 110. In addition, the third electronic component 11 electrically connects to the conductive contacts 150 through the fourth conductive layer 370, the second pillar layer 260 and the package substrate 110.

In another embodiment, the third electronic component 11 may be disposed on the interposer 270 of the semiconductor package 400 of FIG. 4 to form another semiconductor device. In other embodiment, the third electronic component 11 may be disposed on the fourth conductive layer 370 of the semiconductor package 500 of FIG. 5 to form another semiconductor device.

FIGS. 8A to 8H illustrate manufacturing processes of the semiconductor package 100 of FIG. 1.

Figure 8A:
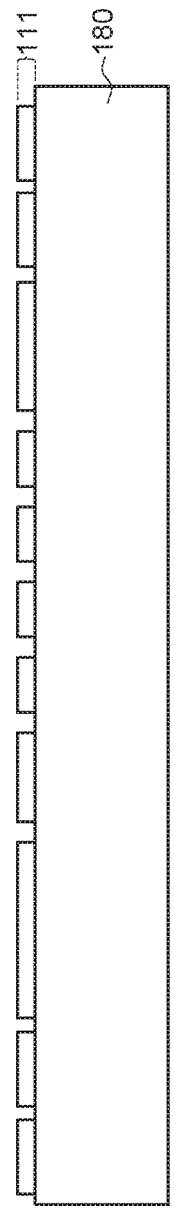

Referring to FIG. 8A, a carrier 180 is provided. The carrier 180 may be formed by a metal plate comprising of copper, iron or steel.

Referring to FIG. 8A, the first conductive layer 111 is formed on the carrier 180 using, for example, photolithography, electroless plating, electrolytic plating, printing, sputtering, vacuum deposition, etc.

Figure 8B:
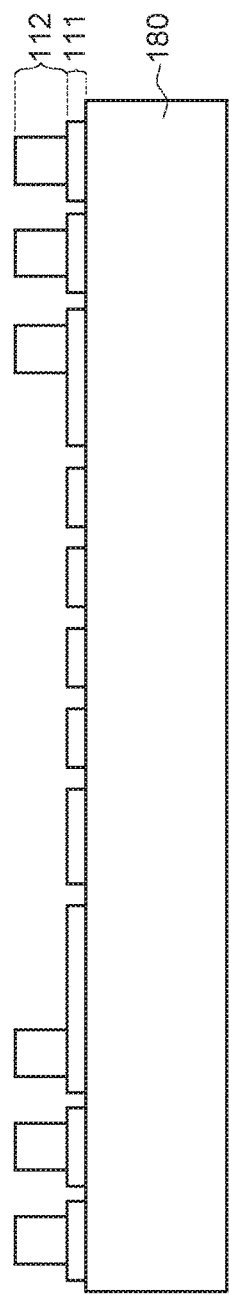

Referring to FIG. 8B, the first pillar layer 112 is formed on the first conductive layer 111 using, for example, photolithography, electroless plating, electrolytic plating, printing, sputtering, vacuum deposition, etc.

Figure 8C:
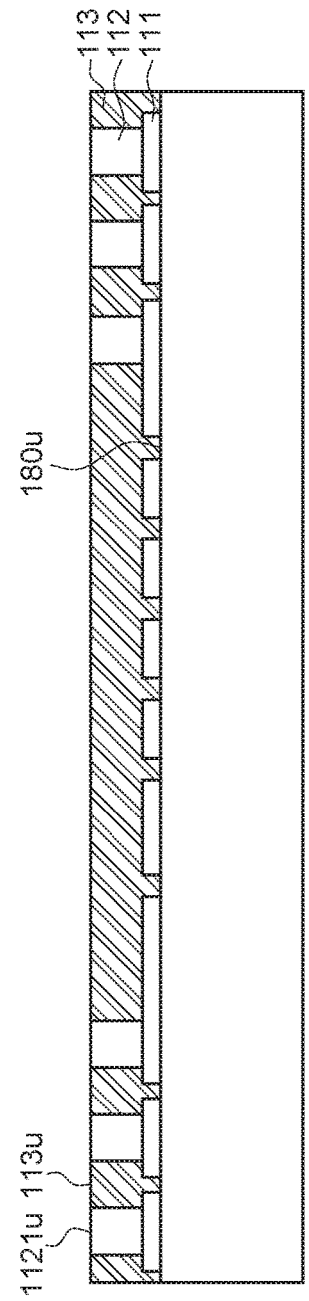

Referring to FIG. 8C, the first package body 113 encapsulating the first conductive layer 111 and the first pillar layer 112 is formed on an upper surface 180u of the carrier 180. The first package body 113 may be formed by various packaging technologies, such as, for example, compression molding, injection molding, transfer molding or dispensing technology.

In the present embodiment, the first package body 113 may be grinded, such that the first upper surface 1121u of each pillar 1121 is exposed from the second upper surface 113u of the first package body 113, wherein the first upper surface 1121u is aligned with the second upper surface 113u.

Figure 8D:
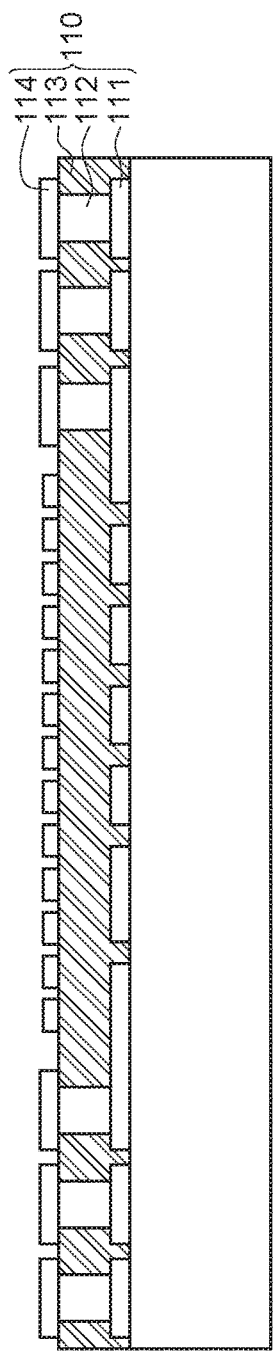

Referring to FIG. 8D, the second conductive layer 114 is formed on the first pillar layer 112 using, for example, photolithography, electroless plating, electrolytic plating, printing, sputtering, vacuum deposition, etc. The first conductive layer 111, the first pillar layer 112, the first package body 113 and the second conductive layer 114 form the package substrate 110.

Figure 8E:
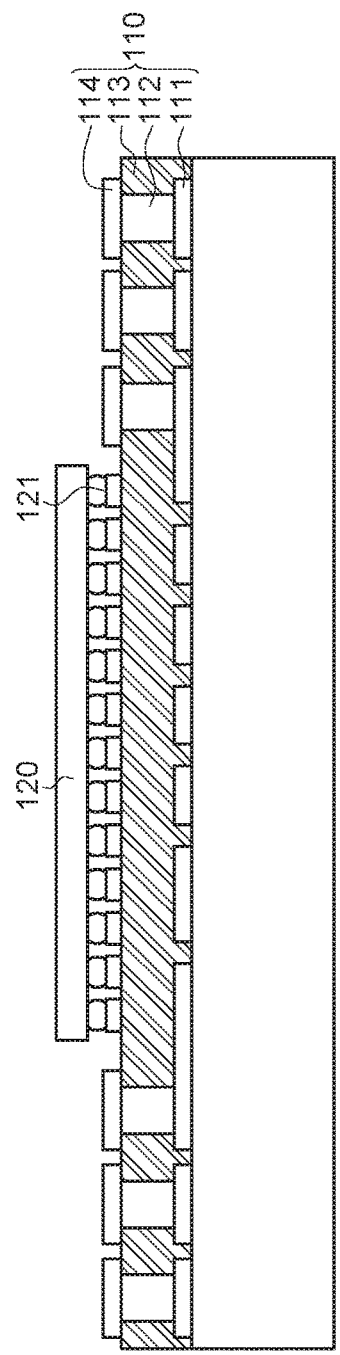

Referring to FIG. 8E, the first electronic component 120 is disposed on second conductive layer 114 of the package substrate 110 through the conductive contacts 121 using, for example, surface mount technology (SMT).

Figure 8F:
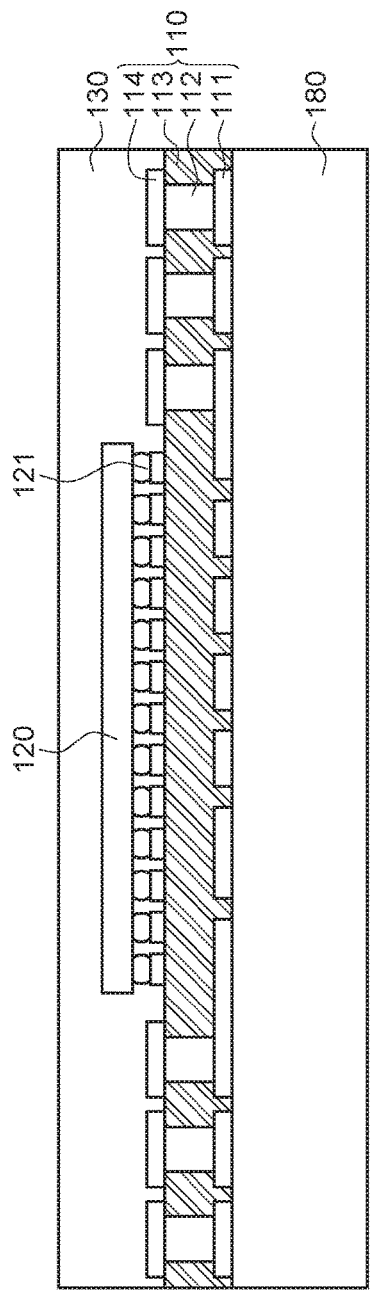

Referring to FIG. 8F, the second package body 130 encapsulating the first electronic component 120 and the second conductive layer 114 is formed on the package substrate 110. The second package body 130 may be formed by various packaging technologies, such as, for example, compression molding, injection molding, transfer molding or dispensing technology.

Figure 8G:
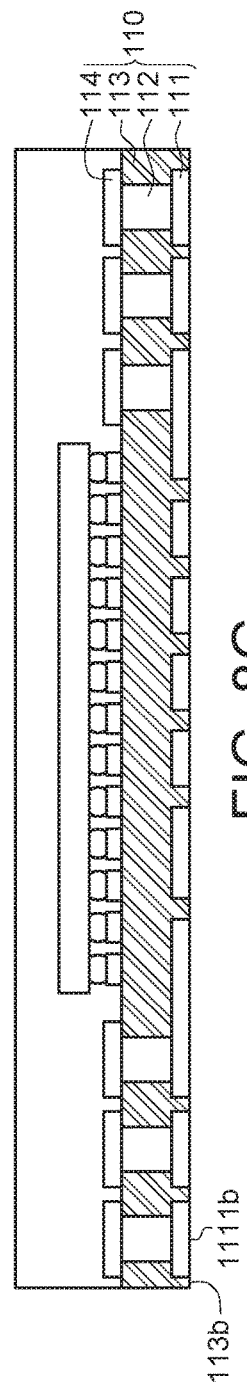

Referring to FIG. 8G, the carrier 180 is removed using, for example, etching, peeling, etc. After the carrier 180 is removed, the first lower surface 1111b of the first conductive layer 111 and the second lower surface 113b of the first package body 113 are exposed, wherein the first lower surface 1111b and the second lower surface 113b are aligned with each other. For example, the first lower surface 1111b and the second lower surface 113b are coplanar.

Referring to FIG. 8H, the conductive contacts 150 are formed on the first lower surface 1111b of the first conductive layer 111 using, for example, ball mounting technology. In addition, the second electronic component 140 is disposed on the first lower surface 1111b of the first conductive layer 111 using, for example, SMT.

Figure 9B:
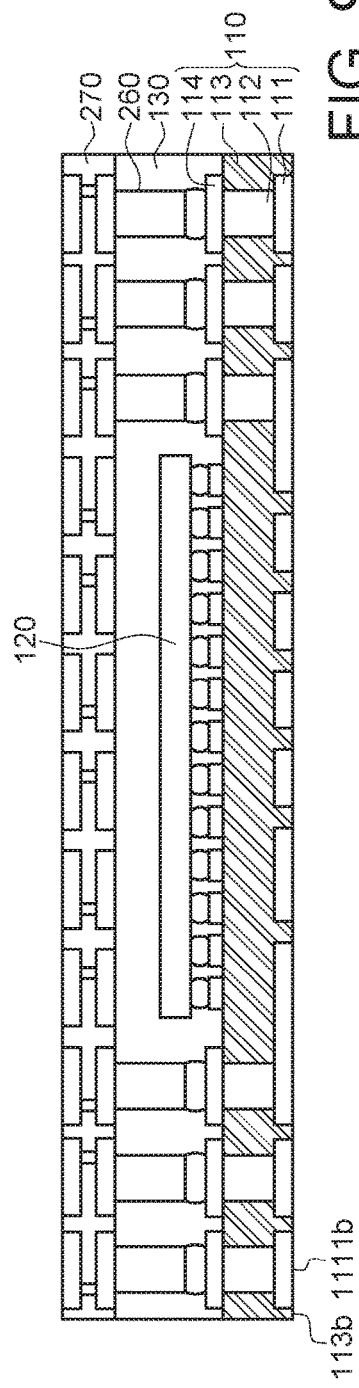

FIGS. 9A to 9B illustrate manufacturing processes of the semiconductor package 200 of FIG. 2.

Referring to FIG. 9A, the interposer 270 connects to the package substrate 110 through the second pillar layer 260. The interposer 270 may electrically connect to the first electronic component 120 through the second pillar layer 260 and the package substrate 110.

Referring to FIG. 9B, the second package body 130 encapsulating the first electronic component 120, the second conductive layer 114 and second pillar layer 260 is formed between the package substrate 110 and the interposer 270. The second package body 130 may be formed by various packaging technologies, such as, for example, compression molding, injection molding, transfer molding or dispensing technology.

Then, referring to FIG. 9B, the carrier 180 is removed. After the carrier 180 is removed, the first lower surface 1111b of the first conductive layer 111 and the second lower surface 113b of the first package body 113 are exposed, wherein the first lower surface 1111b and the second lower surface 113b are aligned with each other. For example, the first lower surface 1111b and the second lower surface 113b are coplanar.

Then, the conductive contacts 150 and the second electronic component 140 are formed on the first lower surface 1111b of the first conductive layer 111 to form the semiconductor package 200 of FIG. 2.

In another embodiment, the third electronic component 11 of FIG. 6 may be disposed on the interposer 270 of FIG. 9B to form the semiconductor device 10 of FIG. 6.

Figure 10A:
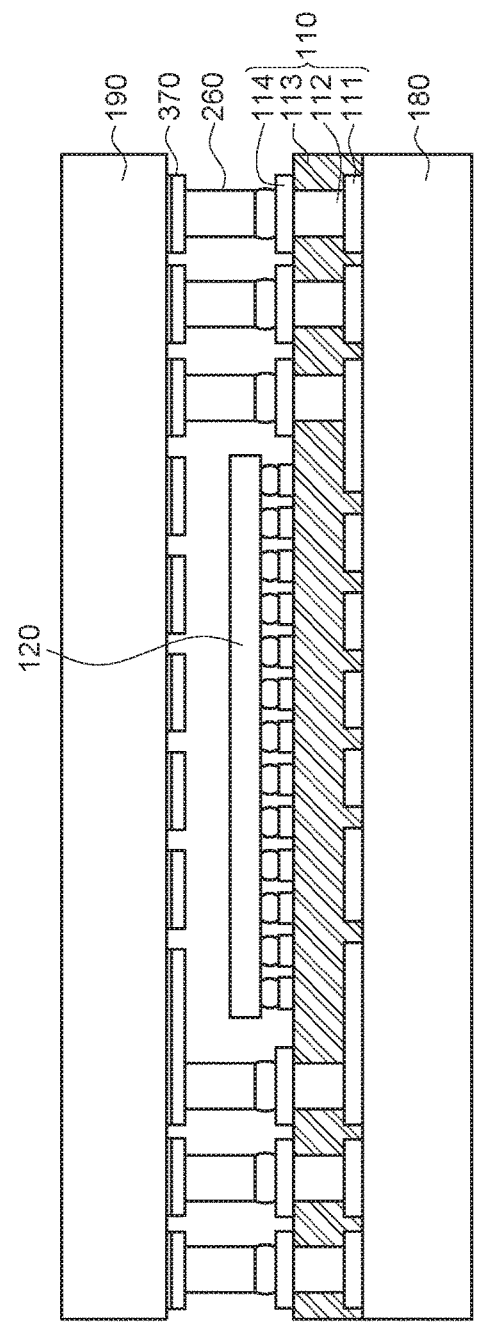

FIGS. 10A to 10C illustrate manufacturing processes of the semiconductor package 300 of FIG. 3.

Referring to FIG. 10A, the fourth conductive layer 370 formed on a carrier 190 connects to the package substrate 110 through the second pillar layer 260. The fourth conductive layer 370 may electrically connect to the first electronic component 120 through the second pillar layer 260 and the package substrate 110.

Referring to FIG. 10B, the second package body 130 encapsulating the first electronic component 120, the second conductive layer 114, the second pillar layer 260 and the fourth conductive layer 370 is formed between the package substrate 110 and the carrier 190. The second package body 130 may be formed by various packaging technologies, such as, for example, compression molding, injection molding, transfer molding or dispensing technology.

Referring to FIG. 10C, the carrier 190 is removed to expose the fourth upper surface 130u of the second package body 130 and the fifth upper surface 371u of the fourth conductive layer 370, wherein the fourth upper surface 130u and the fifth upper surface 371u are aligned with each other.

Referring to FIG. 10C, the carrier 180 is removed. After the carrier 180 is removed, the first lower surface 1111b of the first conductive layer 111 and the second lower surface 113b of the first package body 113 are exposed, wherein the first lower surface 1111b and the second lower surface 113b are aligned with each other. For example, the first lower surface 1111b and the second lower surface 113b are coplanar.

Then, the conductive contacts 150 and the second electronic component 140 are formed on the first lower surface 1111b of the first conductive layer 111 to form the semiconductor package 300 of FIG. 3.

In another embodiment, the third electronic component 11 of FIG. 7 may be disposed on the fourth conductive layer 370 of FIG. 10C to form the semiconductor device 20 of FIG. 7.

FIGS. 11A to 11H illustrate manufacturing processes of the semiconductor package 400 of FIG. 4.

Figure 11A:
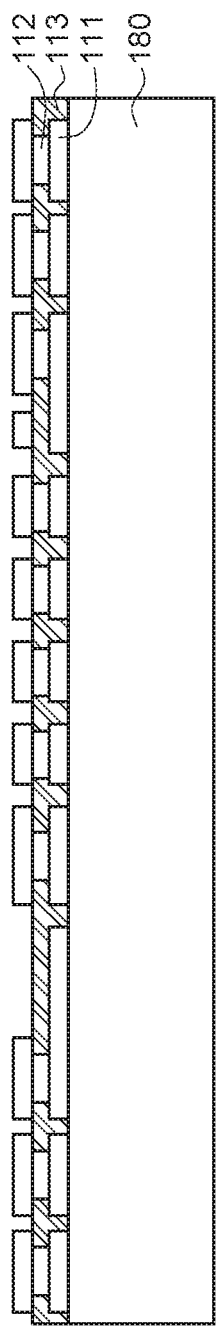
FIGS. 11A to 11H illustrate manufacturing processes of the semiconductor package of FIG. 4.

Referring to FIG. 11A, the carrier 180 is provided. The carrier 180 may be formed by a metal plate comprising of copper, iron or steel.

Referring to FIG. 11A, the first conductive layer 111, the first pillar layer 112, the first package body 113 are formed on the carrier 180 using the processes, as mentioned above.

Figure 11B:
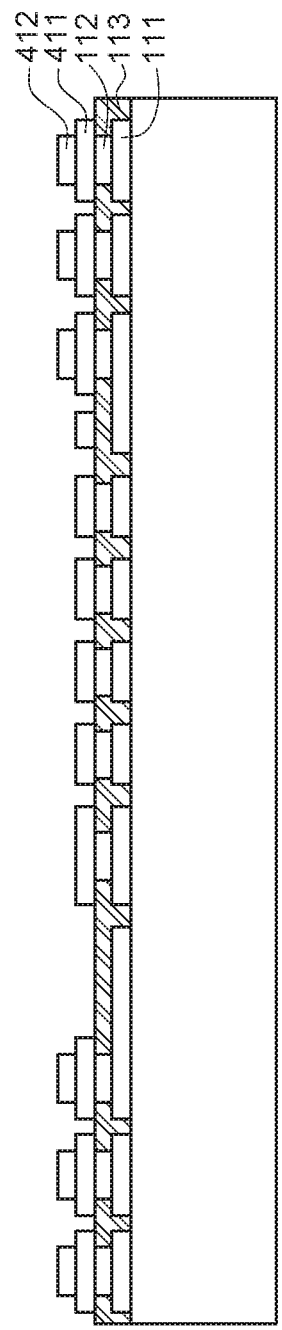

Referring to FIG. 11B, the third pillar layer 411 is formed on the first pillar layer 112 using, for example, photolithography, electroless plating, electrolytic plating, printing, sputtering, vacuum deposition, etc.

Referring to FIG. 11B, the third pillar layer 412 is formed on the third pillar layer 411 using, for example, photolithography, electroless plating, electrolytic plating, printing, sputtering, vacuum deposition, etc.

Figure 11C:
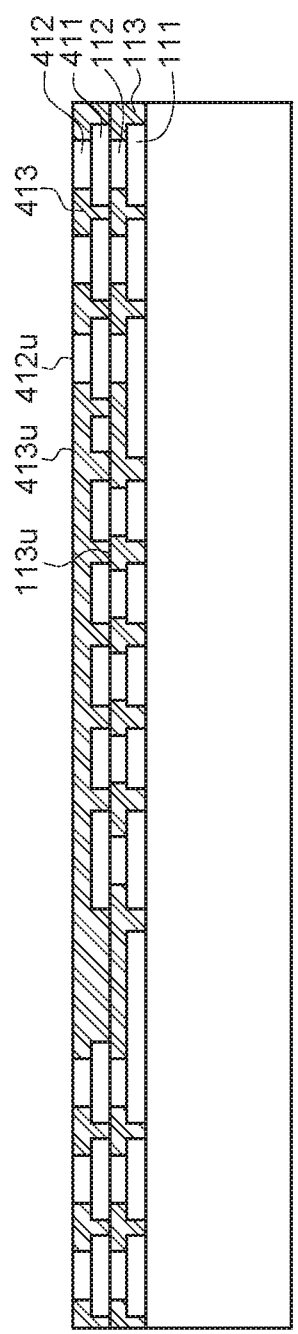

Referring to FIG. 11C, the third package body 413 encapsulating the third conductive layer 411 and the third pillar layer 412 is formed on the second upper surface 113u of the first package body 113. The third package body 413 may be formed by various packaging technologies, such as, for example, compression molding, injection molding, transfer molding or dispensing technology.

In the present embodiment, the third package body 413 may be grinded, such that an upper surface 412u of the third pillar layer 412 is exposed from the sixth upper surface 413u of the third package body 413, wherein the upper surface 412u is aligned with the sixth upper surface 413u.

Figure 11D:
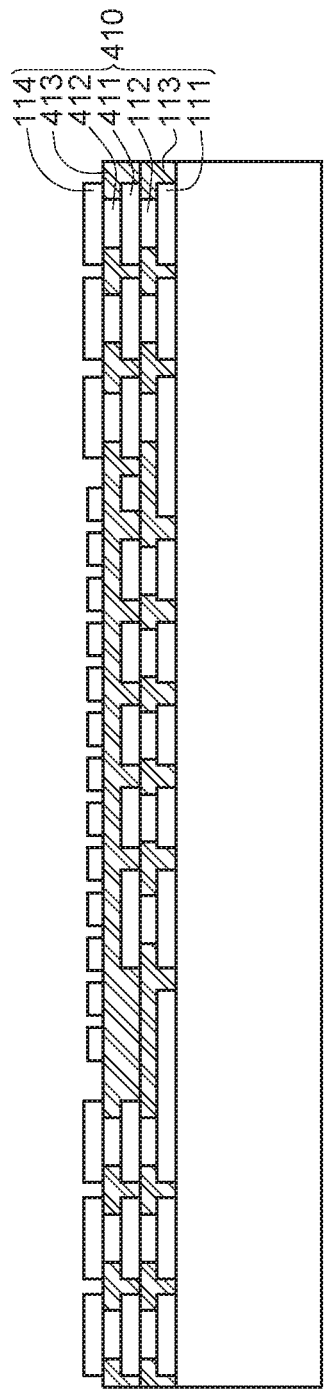

Referring to FIG. 11D, the second conductive layer 114 is formed on the third pillar layer 412 using, for example, photolithography, electroless plating, electrolytic plating, printing, sputtering, vacuum deposition, etc. The first conductive layer 111, the first pillar layer 112, the first package body 113, the second conductive layer 114, the third conductive layer 411, the third pillar layer 412 and the third package body 413 form the package substrate 410.

Figure 11E:
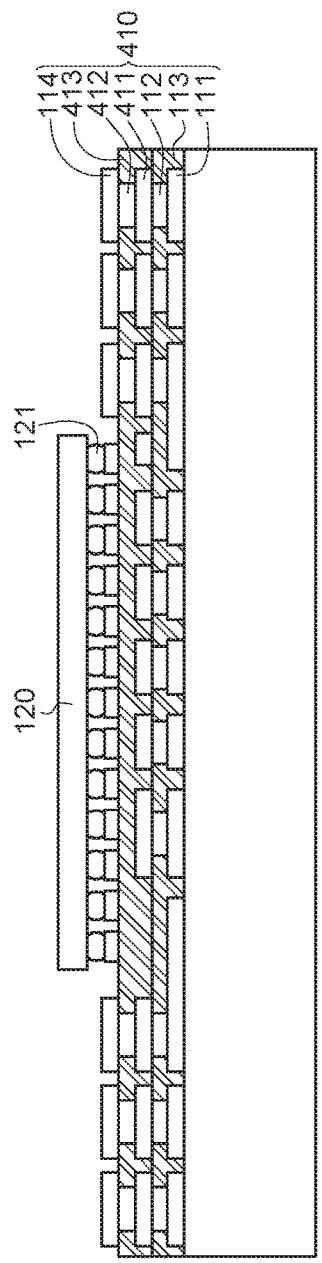

Referring to FIG. 11E, the first electronic component 120 is disposed on second conductive layer 114 of the package substrate 410 through the conductive contacts 121 using, for example, surface mount technology (SMT).

Figure 11F:
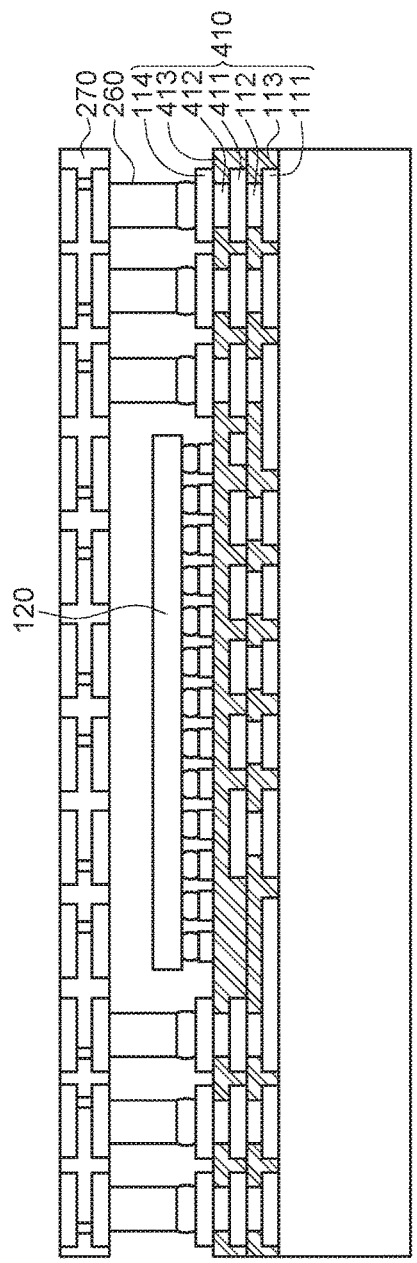

Referring to FIG. 11F, the interposer 270 connects to the package substrate 410 through the second pillar layer 260. The interposer 270 may electrically connect to the first electronic component 120 through the second pillar layer 260 and the package substrate 410.

Figure 11G:
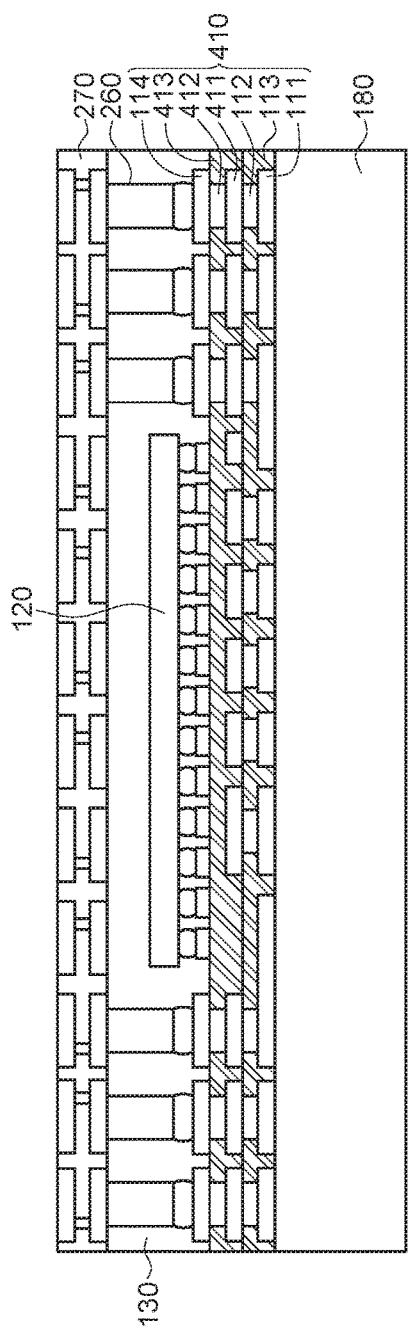

Referring to FIG. 11G, the second package body 130 encapsulating the first electronic component 120, the second conductive layer 114 and second pillar layer 260 is formed between the package substrate 410 and the interposer 270. The second package body 130 may be formed by various packaging technologies, such as, for example, compression molding, injection molding, transfer molding or dispensing technology.

Figure 11H:
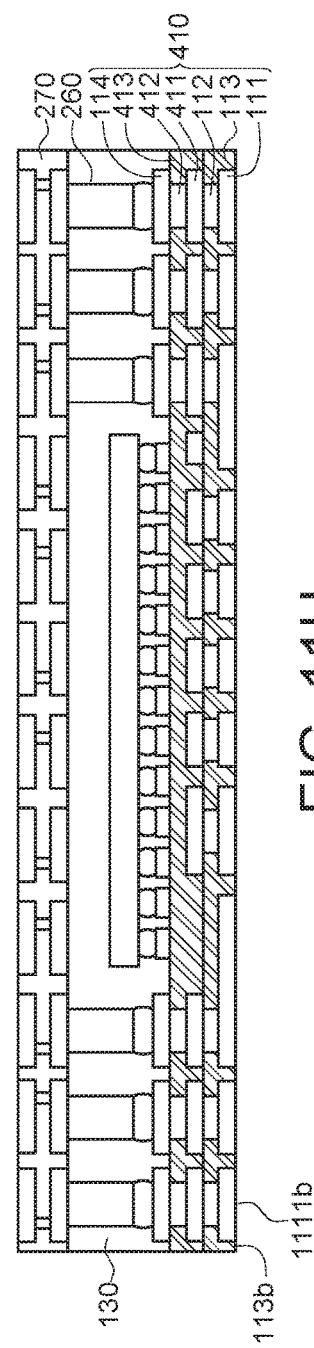

Referring to FIG. 11H, the carrier 180 is removed using, for example, etching, peeling, etc. After the carrier 180 is removed, the first lower surface 1111*b* of the first conductive layer 111 and the second lower surface 113*b* of the first package body 113 are exposed, wherein the first lower surface 1111*b* and the second lower surface 113*b* are aligned with each other. For example, the first lower surface 1111*b* and the second lower face 113*b* are coplanar.

Then, the conductive contacts 150 and the second electronic component 140 are formed on the first lower surface 1111*b* of the first conductive layer 111 to form the semiconductor package 400 of FIG. 4.

In another embodiment, the third electronic component 11 of FIG. 6 may be disposed on the interposer 270 of FIG. 11H to form another semiconductor device.

Figure 12A:
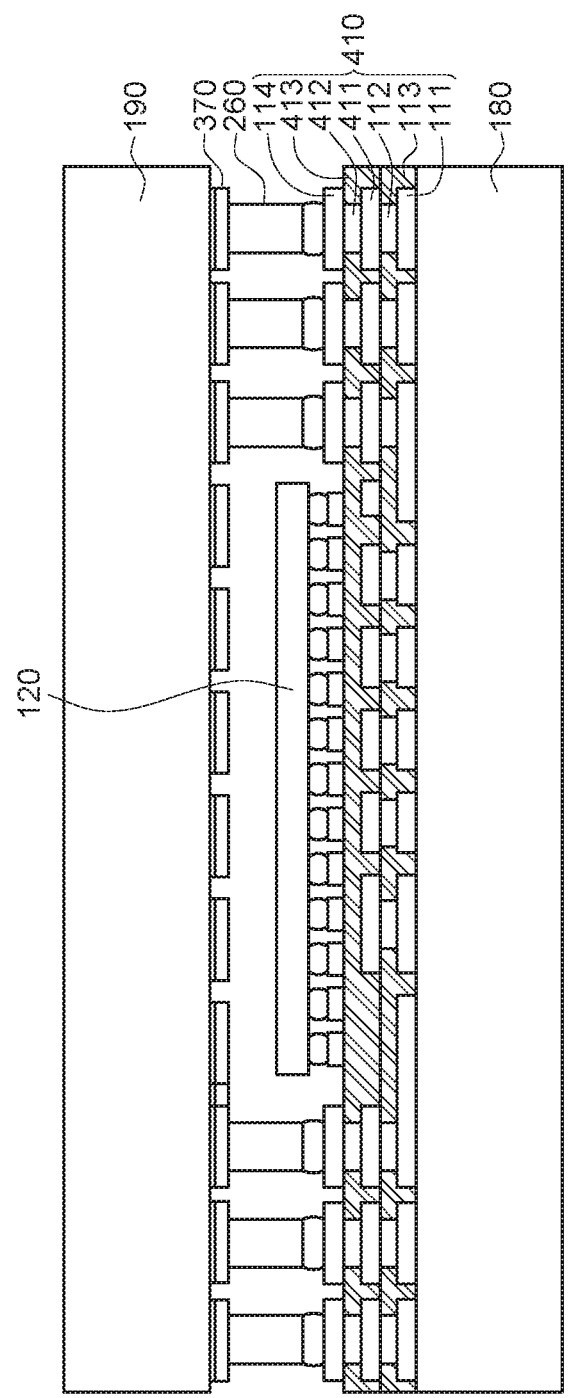
FIGS. 12A to 12C illustrate manufacturing processes of the semiconductor package of FIG. 5.

FIGS. 12A to 12O illustrate manufacturing processes of the semiconductor package 500 of FIG. 5.

Referring to FIG. 12A, the fourth conductive layer 370 formed on the carrier 190 connects to the package substrate 410 through the second pillar layer 260. The fourth conductive layer 370 may electrically connect to the first electronic component 120 through the second pillar layer 260 and the package substrate 410.

Figure 12B:
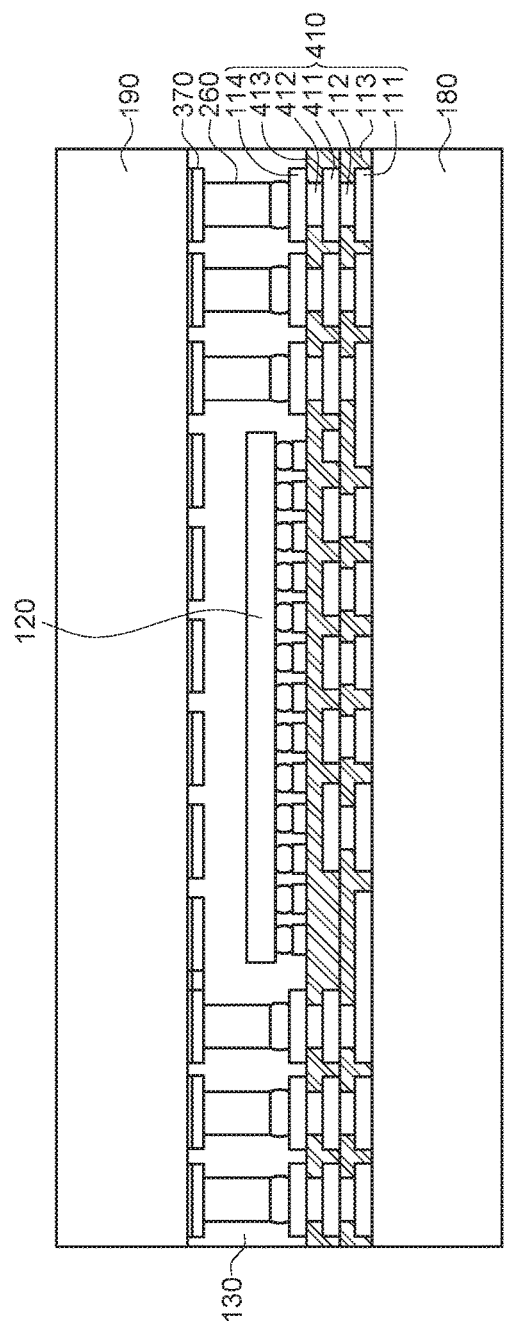
Figure 12C:
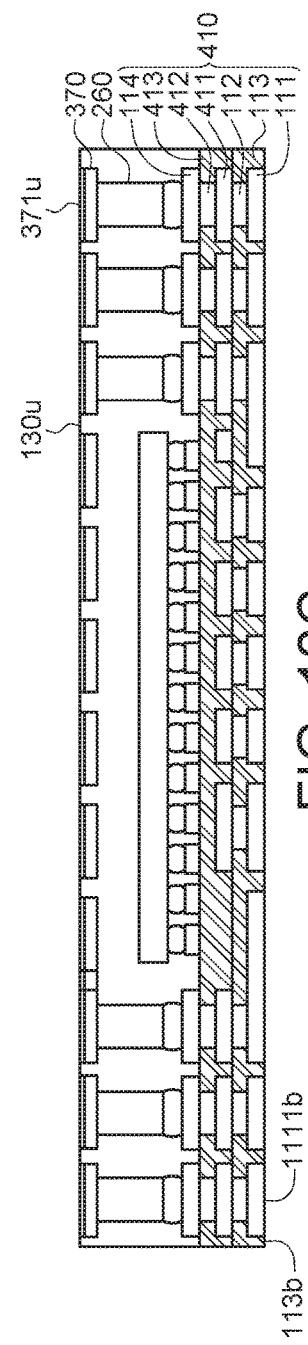

Referring to FIG. 12B, the second package body 130 encapsulating the first electronic component 120, the second conductive layer 114, the second pillar layer 260 and the fourth conductive layer 370 is formed between the package substrate 410 and the carrier 190. The second package body 130 may be formed by various packaging technologies, such as, for example, compression molding, injection molding, transfer molding or dispensing technology.

Referring to FIG. 12O, the carrier 190 is removed to expose the fourth upper surface 130*u* of the second package body 130 and the fifth upper surface 371*u* of the fourth conductive layer 370, wherein the fourth upper surface 130*u* and the fifth upper surface 371*u* are aligned with each other.

Referring to FIG. 12O, the carrier 180 is removed. After the carrier 180 is removed, the first lower surface 1111*b* of the first conductive layer 111 and the second lower surface 113*b* of the first package body 113 are exposed, wherein the first lower surface 1111*b* and the second lower surface 113*b* are aligned with each other. For example, the first lower surface 1111*b* and the second lower surface 113*b* are coplanar.

Then, the conductive contacts 150 and the second electronic component 140 are formed on the first lower surface 1111*b* of the first conductive layer 111 to form the semiconductor package 500 of FIG. 5.

In another embodiment, the third electronic component 11 of FIG. 7 may be disposed on the fourth conductive layer 370 of FIG. 12O to form another semiconductor device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a semiconductor package, comprising:
    providing a carrier;
    forming a package substrate, comprising:
    forming a first conductive layer on the carrier;
    forming a first pillar layer on the first conductive layer;
    forming a first package body encapsulating the first conductive layer and the first pillar layer; and
    forming a second conductive layer on the first pillar layer, wherein the second conductive layer is in direct contact with the first pillar layer;
    disposing a first electronic component above the second conductive layer of the package substrate;
    forming a second package body encapsulating the first electronic component and the second conductive layer; and
    removing the carrier.

2. The manufacturing method as claimed in claim 1, wherein the first package body is molding compound.

3. The manufacturing method as claimed in claim 1, further comprises:
    forming a second pillar layer connecting to the package substrate.

4. The manufacturing method as claimed in claim 1, further comprises:
    forming a third conductive layer on the first package body;
    forming a third pillar layer on the third conductive layer; and
    forming a third package body encapsulating the third pillar layer and the third conductive layer;
    wherein in the step of forming the second conductive layer, the second conductive layer is connected to the first pillar layer through the third pillar layer and the third conductive layer.

5. The manufacturing method as claimed in claim 4, wherein the third package body is molding compound.

6. The manufacturing method as claimed in claim 1, wherein in the step of forming the package substrate, the first conductive layer has a first lower surface, the first package body has a second lower surface, the first lower surface is exposed form from the second lower surface, and the manufacturing method further comprises:
    disposing a second electronic component on the first lower surface of the first conductive layer.

7. The manufacturing method as claimed in claim 1, further comprising:
    disposing an interposer on the second package body and electrically connecting to the package substrate.

8. The manufacturing method as claimed in claim 1, further comprising:
    forming a second pillar layer connecting to the second conductive layer;
    forming a fourth conductive layer on the second pillar layer through another carrier;
    wherein in the step of forming the second package body, the second package body encapsulates the second pillar layer and the fourth conductive layer.

9. The manufacturing method as claimed in claim 1, wherein in the step of forming the package substrate, the first pillar layer has a first upper surface, the first package body has a second upper surface, and the first upper surface is aligned with the second upper surface.

10. The manufacturing method as claimed in claim 1, wherein in the step of forming the package substrate, the first conductive layer has a first lower surface, the first package body has a second lower surface, and the first lower surface is aligned with the second lower surface.

11. A manufacturing method of a semiconductor device, comprising:
    providing a carrier;
    forming a package substrate, comprising:
    forming a first conductive layer on the carrier;

forming a first pillar layer on the first conductive layer;

forming a first package body encapsulating the first conductive layer and the first pillar layer; and forming a second conductive layer on the first pillar layer;

disposing a first electronic component above the second conductive layer of the package substrate;

connecting a second pillar layer to the package substrate;

forming a second package body encapsulating the first electronic component, the second conductive layer and the second pillar layer;

removing the carrier;

disposing a third electronic component above the second package body, wherein the third electronic component electrically connects to the package substrate through the second pillar layer.

12. The manufacturing method as claimed in claim 11, wherein the step of forming the package substrate further comprises:

forming a third conductive layer on the first package body;

forming a third pillar layer connecting to the third conductive layer; and forming a third package body encapsulating the third conductive layer and the third pillar layer.

13. The manufacturing method as claimed in claim 12, wherein the third package body is molding compound.

14. The manufacturing method as claimed in claim 11, wherein in the step of forming the package substrate, the first conductive layer has a first lower surface, the first package body has a second lower surface, the first lower surface is exposed form from the second lower surface, and the manufacturing method further comprises:

disposing a second electronic component on the first lower surface of the first conductive layer.

15. The manufacturing method as claimed in claim 11, further comprising:

disposing an interposer on the second package body and electrically connecting to the package substrate through the second pillar layer.

16. The manufacturing method as claimed in claim 11, further comprising:

forming a fourth conductive layer on the second pillar layer through another carrier;

wherein in the step of forming the second package body, the second package body encapsulates the second pillar layer and the fourth conductive layer.

17. The manufacturing method as claimed in claim 11, wherein the first package body is molding compound.

18. The manufacturing method as claimed in claim 11, wherein in the step of forming the package substrate, the first pillar layer has a first upper surface, the first package body has a second upper surface, and the first upper surface is aligned with the second upper surface.

19. The manufacturing method as claimed in claim 11, wherein in the step of forming the package substrate, the first conductive layer has a first lower surface, the first package body has a second lower surface, and the first lower surface is aligned with the second lower surface.

20. The manufacturing method as claimed in claim 11, further comprising:

disposing an interposer on the second package body and electrically connecting to the package substrate through the second pillar layer;

wherein in the step of disposing the third electronic component, the third electronic component is disposed on and electrically to the interposer.

* * * * *